United States Patent
Marbella et al.

(10) Patent No.: US 10,085,353 B2
(45) Date of Patent: Sep. 25, 2018

(54) SOLDER BRIDGING PREVENTION STRUCTURES FOR CIRCUIT BOARDS AND SEMICONDUCTOR PACKAGES

(71) Applicant: Infineon Technologies AG, Neubiberg (DE)

(72) Inventors: Carlo Baterna Marbella, Singapore (SG); Fabian Schnoy, Tegernheim (DE)

(73) Assignee: Infineon Technologies AG, Neubiberg (DE)

( * ) Notice: Subject to any disclaimer, the term of this patent is extended or adjusted under 35 U.S.C. 154(b) by 1060 days.

(21) Appl. No.: 14/077,642

(22) Filed: Nov. 12, 2013

(65) Prior Publication Data

US 2015/0131249 A1    May 14, 2015

(51) Int. Cl.
| | | |
|---|---|---|
| *H05K 7/10* | (2006.01) | |
| *H05K 7/12* | (2006.01) | |
| *H05K 3/34* | (2006.01) | |
| *H05K 1/11* | (2006.01) | |

(52) U.S. Cl.
CPC ............ *H05K 3/3452* (2013.01); *H05K 1/111* (2013.01); *H05K 3/3436* (2013.01); *H05K 2201/09045* (2013.01); *H05K 2201/09909* (2013.01); *H05K 2201/10734* (2013.01)

(58) Field of Classification Search
USPC .......................................... 361/767; 174/251
See application file for complete search history.

(56) References Cited

U.S. PATENT DOCUMENTS

| | | | | |
|---|---|---|---|---|
| 6,323,045 B1* | 11/2001 | Cline | .................... | H01L 21/485 |
| | | | | 228/180.22 |
| 2004/0132230 A1* | 7/2004 | Kim | .................... | H01L 21/4846 |
| | | | | 438/106 |
| 2005/0023704 A1* | 2/2005 | Lin | .................... | H01L 23/49816 |
| | | | | 257/781 |

FOREIGN PATENT DOCUMENTS

| | | |
|---|---|---|
| CN | 1747157 A | 3/2006 |
| JP | H0555229 A | 3/1993 |
| WO | 2008094714 A1 | 8/2008 |

* cited by examiner

*Primary Examiner* — Andargie M Aychillhum
(74) *Attorney, Agent, or Firm* — Murphy, Bilak & Homiller, PLLC

(57) ABSTRACT

A board for mechanically supporting and electrically connecting electronic components includes a non-conductive substrate, a plurality of electrically conductive traces and pads disposed on the non-conductive substrate, and a solder mask applied to the non-conductive substrate and covering the traces. Metal lines are disposed on the non-conductive substrate under the solder mask and along at least two sides of the pads disposed in corners of the non-conductive substrate, so that a metal line is interposed between the pads in the corners of the non-conductive substrate and each adjacent pad. The metal lines form a raised region in the solder mask along the metal lines which prevents solder bridging in the corners of the non-conductive substrate during solder reflow. A corresponding semiconductor package and semiconductor assembly with such solder bridging prevention structures are also provided.

20 Claims, 11 Drawing Sheets

SOLDER BRIDGING PREVENTION STRUCTURES FOR CIRCUIT BOARDS AND SEMICONDUCTOR PACKAGES

TECHNICAL FIELD

The present application relates to circuit boards and semiconductor packages, in particular preventing solder bridging on circuit boards and semiconductor packages.

BACKGROUND

Solder bridging is an unintended electrical connection between two conductors by means of a small blob of solder. In semiconductor packaging and board assembly, solder bridging between a semiconductor package and board solder joint is a major concern. Warpage of the semiconductor package and/or the board increases the risk of solder bridging of the solder joint between the die to package or package to board. Warpage is generally higher the farther away from the neutral point (i.e. center of package). As such, the risk of solder bridging is greatest in the corner area pads or corner joints. Conventional approaches for avoiding solder bridging involve optimization of the package and board design, and selection of the package and board bill of materials to reduce warpage of the package and board. However, such conventional approaches have a limited effect on warpage reduction. In addition, the complexity involved in arriving at an optimum solution is very high e.g. due to the variability of possible board designs across different customers which in turn raises the cost of the board and package.

SUMMARY

According to an embodiment of a board for mechanically supporting and electrically connecting electronic components, the board comprises a non-conductive substrate, a plurality of electrically conductive traces and pads disposed on the non-conductive substrate, and a solder mask applied to the non-conductive substrate and covering the traces. Metal lines are disposed on the non-conductive substrate under the solder mask and along at least two sides of the pads disposed in corners of the non-conductive substrate, so that a metal line is interposed between the pads in the corners of the non-conductive substrate and each adjacent pad. The metal lines form a raised region in the solder mask along the metal lines. The raised region in the solder mask prevents solder bridging in the corners of the non-conductive substrate during solder reflow.

According to an embodiment of a semiconductor package, the semiconductor package comprises a non-conductive substrate, a semiconductor die attached to a first side of the non-conductive substrate, a plurality of electrically conductive traces and pads disposed on a second side of the non-conductive substrate opposing the first side, and a solder mask applied to the non-conductive substrate and covering the traces. Metal lines are disposed on the second side of the non-conductive substrate under the solder mask and along at least two sides of the pads disposed in corners of the non-conductive substrate, so that a metal line is interposed between the pads in the corners of the non-conductive substrate and each adjacent pad. The metal lines form a raised region in the solder mask along the metal lines. The raised region in the solder mask prevents solder bridging in the corners of the non-conductive substrate during solder reflow.

According to an embodiment of a semiconductor assembly, the semiconductor assembly comprises a board including a non-conductive substrate with a plurality of electrically conductive traces and pads and a solder mask covering the traces and a semiconductor package attached to the board. The semiconductor board comprises a semiconductor die attached to a side of a non-conductive substrate facing away from the board, and a plurality of electrically conductive traces and pads and a solder mask covering the traces on a side of the non-conductive substrate facing the board. A plurality of solder bumps connect the pads of the board to the pads of the semiconductor package. Metal lines are disposed on the non-conductive substrate of at least one of the board and the semiconductor package under the solder mask and along at least two sides of the pads disposed in corners of the non-conductive substrate, so that a metal line is interposed between the pads in the corners of the non-conductive substrate on which the metal lines are disposed and each adjacent pad. The metal lines form a raised region in the solder mask along the metal lines. The raised region in the solder mask prevents solder bridging in the corners of the non-conductive substrate during solder reflow.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 7, which includes

FIG. 8, which includes

FIG. 9, which includes

DETAILED DESCRIPTION

The embodiments described herein provide a semiconductor package substrate and/or board with additional metal lines disposed between or surrounding the input/output (I/O) pads for solder bridging prevention. The layout can be implemented directly to the semiconductor package substrate and/or board with no expected additional variable or process cost except for a one-time design change or implementation cost.

Figure 1:
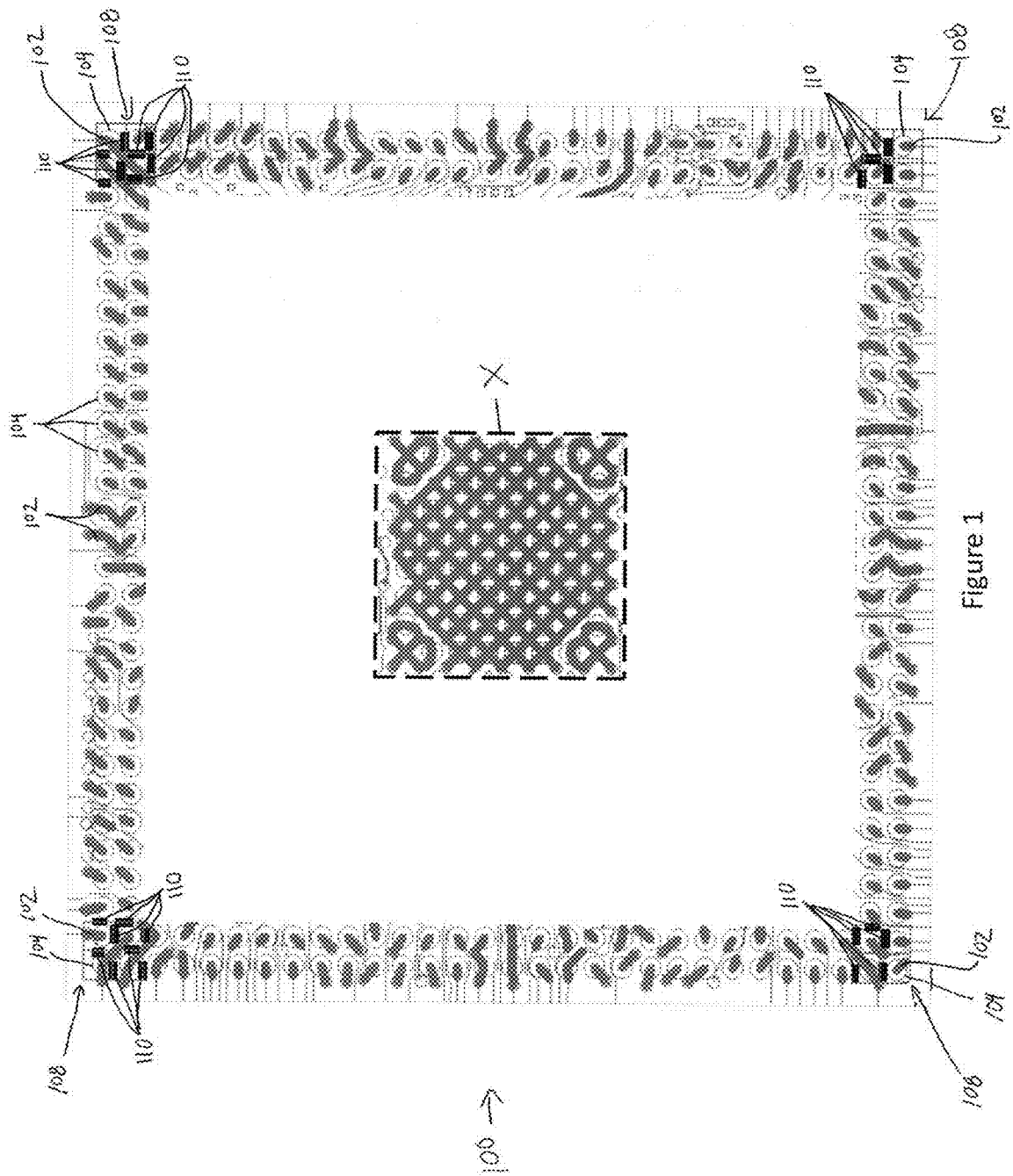
FIG. 1 illustrates a plan view of an embodiment of a circuit board with solder bridging prevention structures.

FIG. 1 illustrates a plan view of an embodiment of a board 100 such as a printed circuit board (PCB) for mechanically supporting and electrically connecting electronic components using conductive traces 102 and pads 104 etched or otherwise patterned from metal (e.g. copper) sheet(s) laminated onto a non-conductive substrate 106. The board 100 can be single sided (e.g. one copper layer), double sided (e.g. two copper layers) or multi-layer. Conductors on different layers can be connected with plated-through holes called vias. The board 100 can contain components such as capacitors, resistors or active devices, embedded in the substrate 106. A semiconductor package with a semiconductor die can be attached to the board 100, the overlay of the semiconductor die being indicated by the dashed box labelled 'X' in FIG. 1.

A solder mask is applied to the non-conductive substrate 106 and covers the traces 102. The solder mask is not shown in FIG. 1 so that the traces 102 and other metal structures on the substrate 106 are easily visible. Several of the electrical connections on the board 100 are also not shown for ease of illustration. The solder mask, also commonly referred to as solder stop mask or solder resist, is a thin layer of polymer applied to the traces 102 on the board 100 for protection against oxidation and to prevent solder bridges from forming between closely spaced solder pads 104 during solder reflow. However, solder bridging can still occur since the solder mask is thin (typically between 10 μm and 30 μm thick).

To provide more robust protection against solder bridging, particularly in the corners 108 of the board 100 where solder bridging is expected to be most problematic, metal lines 110 are disposed on the non-conductive substrate 106 of the board 100 under the solder mask and along at least two sides of the pads 104 disposed in the corners 108 of the substrate 106 so that a metal line 110 is interposed between the pads 104 in the corners 108 of the substrate 106 and each adjacent pad 104. The metal lines 110 can be etched or otherwise patterned from the same metal sheet(s) as the traces 102 and pads 104. The metal lines 110 form a raised region in the solder mask along the metal lines 110. The raised region of the solder mask acts as a dam or barrier, to prevent solder bridging in the corners 108 of the substrate 106 during solder reflow.

Figure 2:
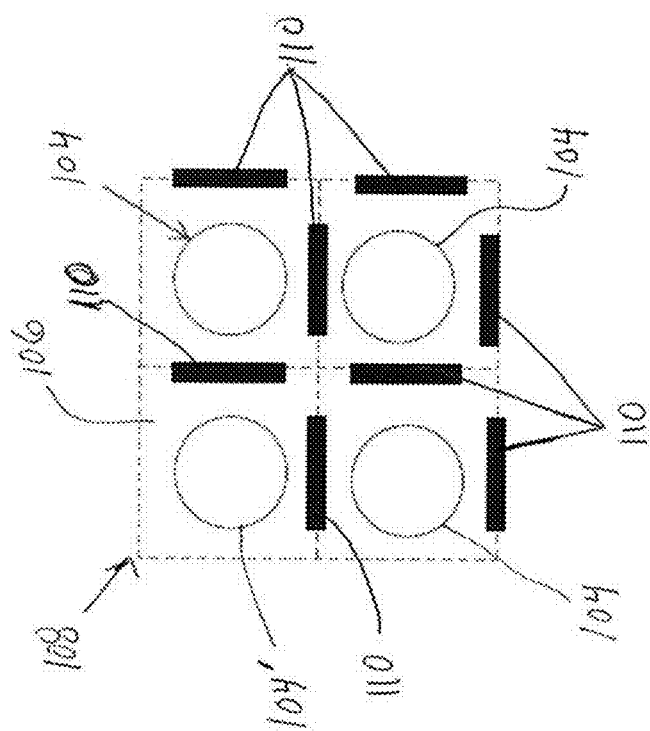
FIG. 2 is an enlarged view of the upper-left corner of the circuit board of FIG. 1.

FIG. 2 is an enlarged plan view of the upper left corner of the board 100 shown in FIG. 1. The metal traces 102 and solder mask are not shown in FIG. 2 for ease of illustration. A metal line 110 is interposed between the corner-most pad 104' and each adjacent pad 104 to prevent solder bridging between these pads 104', 104 in the corners 108 during solder reflow. Additional metal lines 110 can be provided between adjacent ones of the pads 104 closest to the corner-most pad 104' as shown in FIG. 2.

Figure 3:
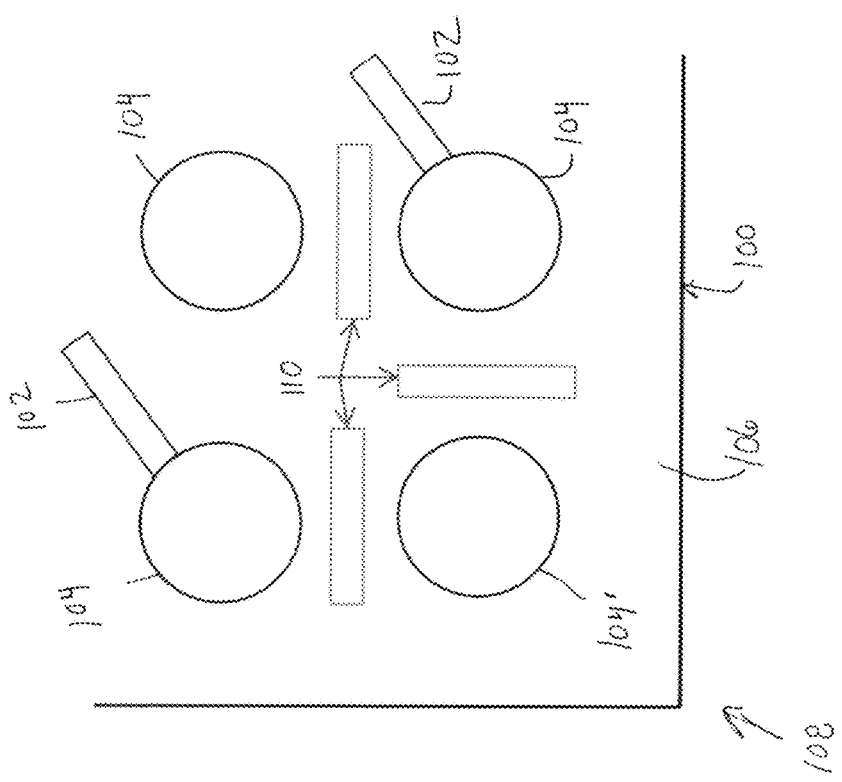
FIG. 3 illustrates a plan view of an embodiment of a corner of a circuit board with solder bridging prevention structures.

FIG. 3 is a plan view of the lower left corner of a board 100 with metal lines 110 for preventing solder bridging in the corners 108 of the board 100, according to another embodiment. In this embodiment, the metal lines 110 are electrically isolated from the traces 102 and the pads 104 disposed on the non-conductive substrate 106.

Figure 4:
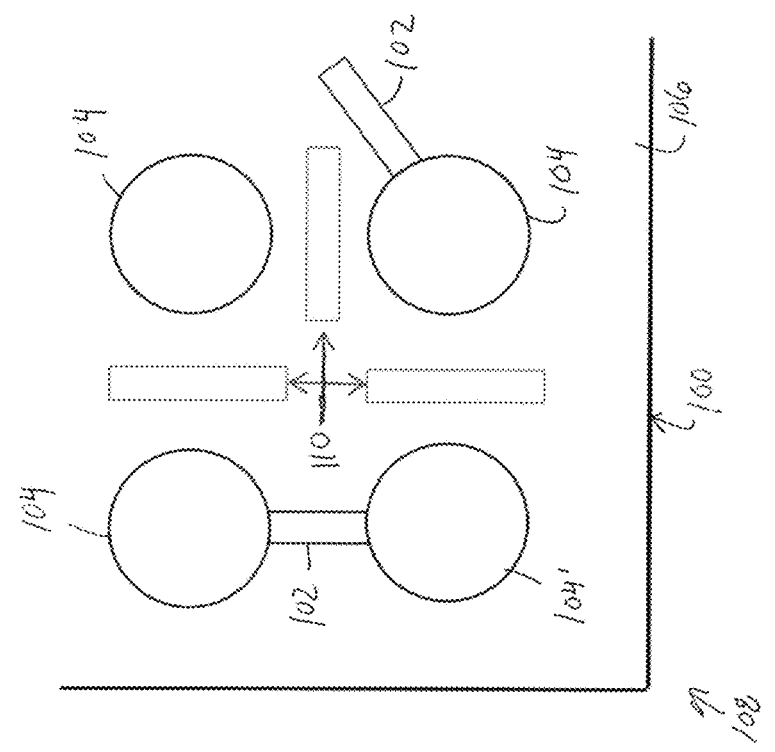
FIG. 4 illustrates a plan view of another embodiment of a corner of a circuit board with solder bridging prevention structures.

FIG. 4 is a plan view of the lower left corner of a board 100 with metal lines 110 for preventing solder bridging in the corners 108 of the board 100, according to yet another embodiment. In this embodiment, the corner-most pad 104' is connected to an adjacent pad 104 by a trace 102. No additional metal lines for preventing solder bridging are provided between these two pads 104', 104 in this area of the non-conductive substrate 106.

Figure 5:
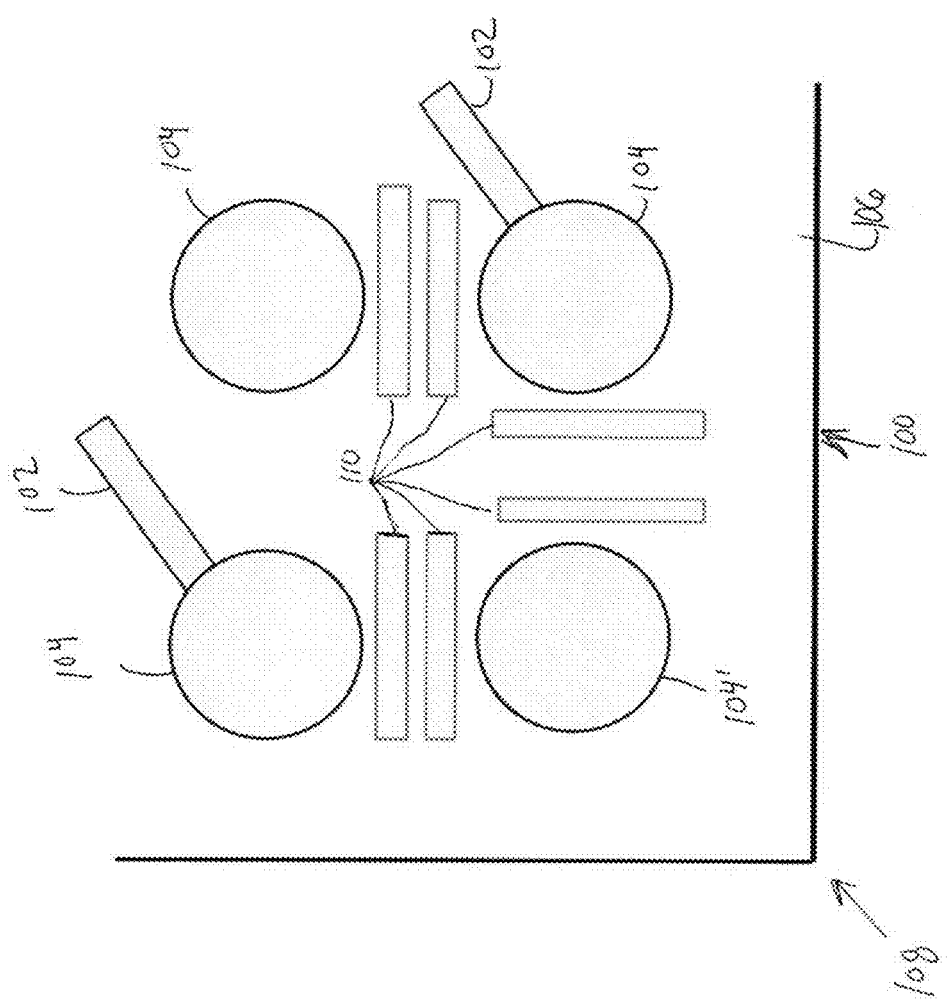
FIG. 5 illustrates a plan view of yet another embodiment of a corner of a circuit board with solder bridging prevention structures.

FIG. 5 is a plan view of the lower left corner of a board 100 with metal lines 110 for preventing solder bridging in the corners 108 of the board 100, according to still another embodiment. In this embodiment, at least two metal lines 110 are interposed between the corner-most pad 104' and each adjacent pad 104.

Figure 6:
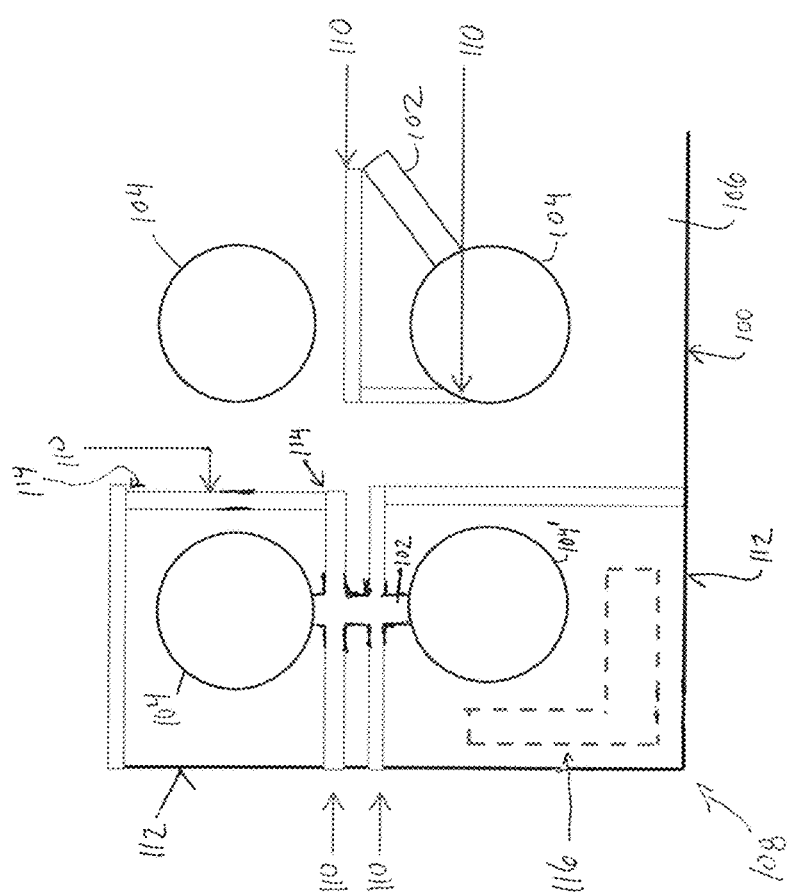
FIG. 6 illustrates a plan view of still another embodiment of a corner of a circuit board with solder bridging prevention structures.

FIG. 6 is a plan view of the lower left corner of a board 100 with metal lines 110 for preventing solder bridging in the corners 108 of the board 100, according to a further embodiment. In this embodiment, at least some of the metal lines 110 are connected to the pad 104', 104 adjacent that metal line 110 or the trace 102 connected to that pad 104', 104 or both. Also according to this embodiment, at least some of the metal lines 110 terminate at an edge 112 of the non-conductive substrate 106 and the corner-most pad 104' is surrounded on all sides by adjacent ones of the metal lines 110 and the edge 112 of the substrate 106. The metal lines 110 adjacent the corner-most pad 104' can extend perpendicular to one another and be connected at one end 114 as shown in FIG. 6. These adjacent metal lines 110 connected at one end 114 can also terminate at the edge 112 of the non-conductive substrate 106. A corner region 116 of the non-conductive substrate 106 between the edge 112 of the substrate 106 and the corner-most pad 104' disposed in that corner 108 of the substrate 106 can be devoid of the metal lines 110 as indicated by the dashed box in FIG. 6. Also, each metal line 110 can be spaced closer to one pad 104', 104 in the corners 108 of the non-conductive substrate 106 than the adjacent pads 104', 104. That is, the metal lines 110 are not centered between adjacent pads 104', 104. Some of the metal lines 110 can be connected at both ends to the adjacent pad 104', 104 and/or to a trace 102 connected to that pad 104', 104 as shown in the lower right corner of FIG. 6.

Figures 7A, 7B:
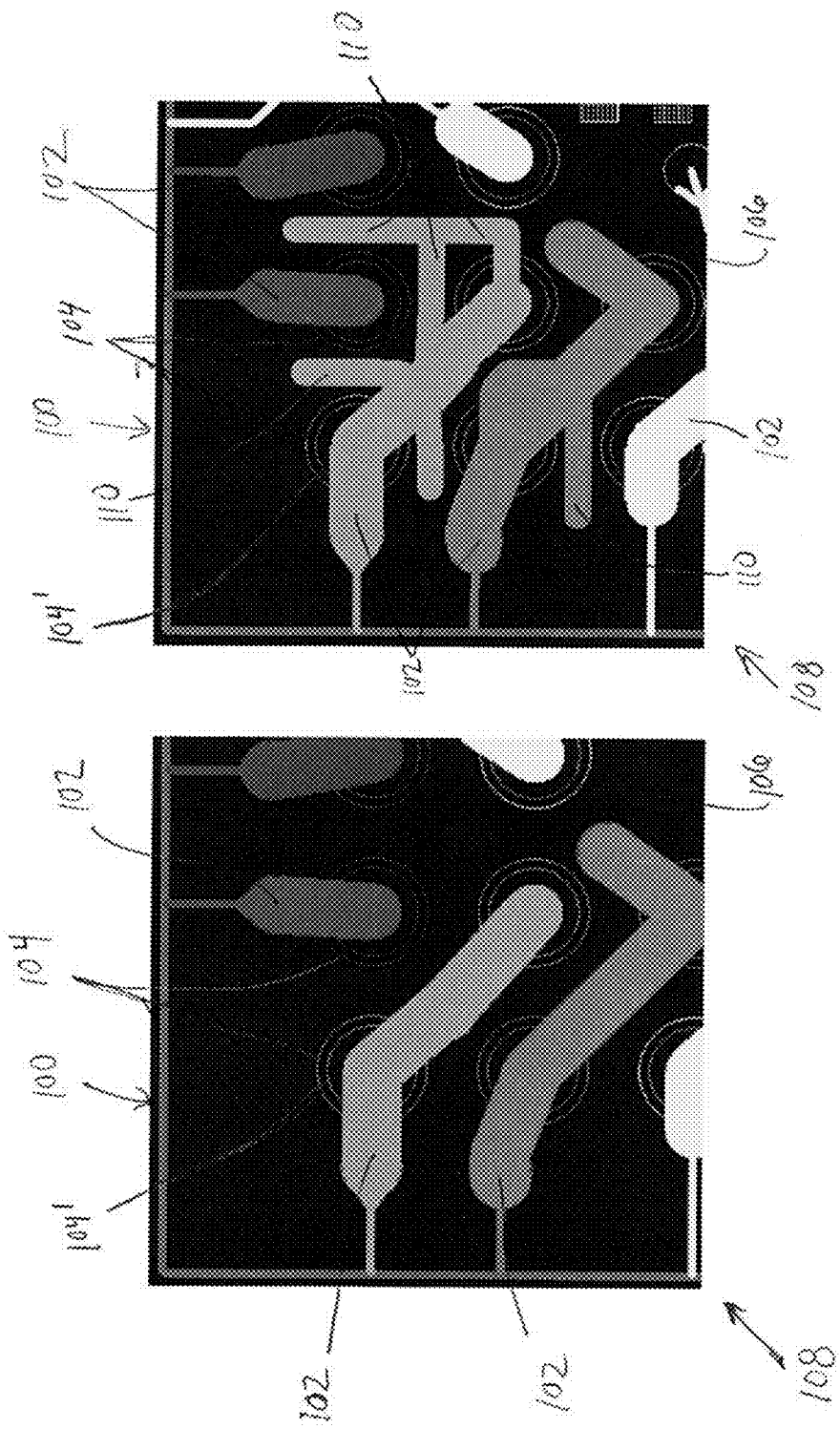
FIGS. 7A and 7B, illustrates a plan view of a corner of a circuit board before and after formation of solder bridging prevention structures, according to an embodiment.

FIG. 7, which includes FIGS. 7A and 7B, shows an embodiment of a corner 108 of an existing board layout after modification with metal lines 110 that prevent solder bridging in the corner 108 of the board 100 during solder reflow. FIG. 7A shows the board layout prior to modification, and FIG. 7B shows the board layout after modification with the additional metal lines 110. According to this embodiment, each metal line 110 is connected to the pad 104', 104 adjacent that metal line 110 or the trace 102 connected to that pad 104', 104 or both, and provides a dam or barrier structure for preventing solder bridging.

Figure 8B:
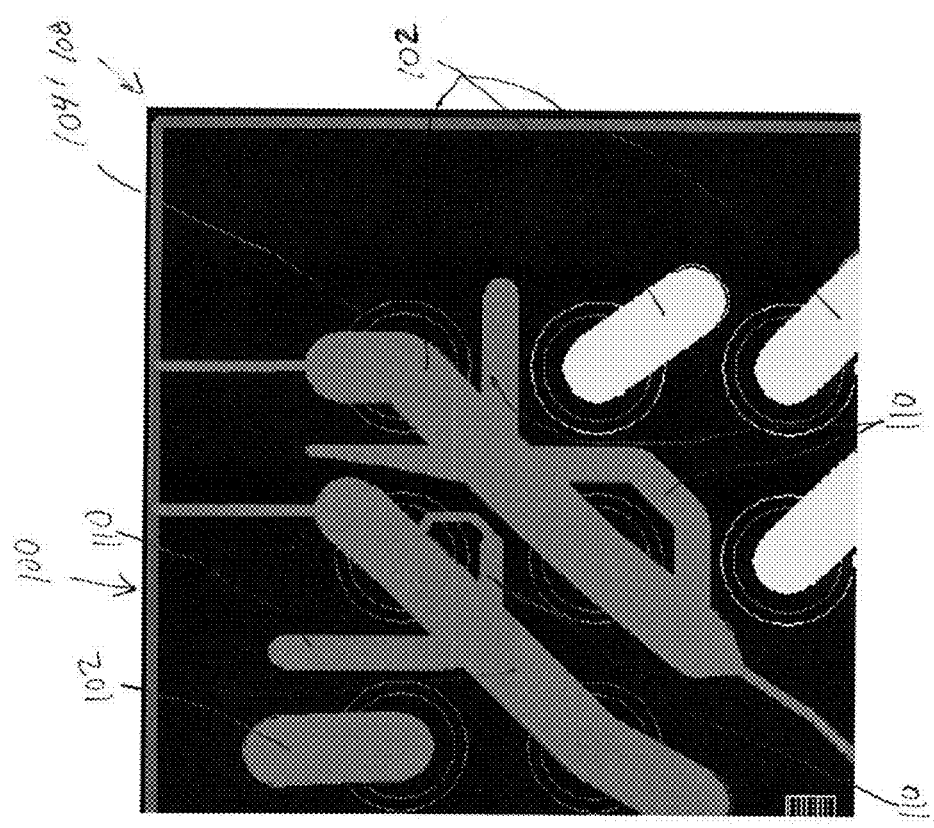
FIGS. 8A and 8B, illustrates a plan view of a corner of a circuit board before and after formation of solder bridging prevention structures, according to another embodiment.
Figure 8A:
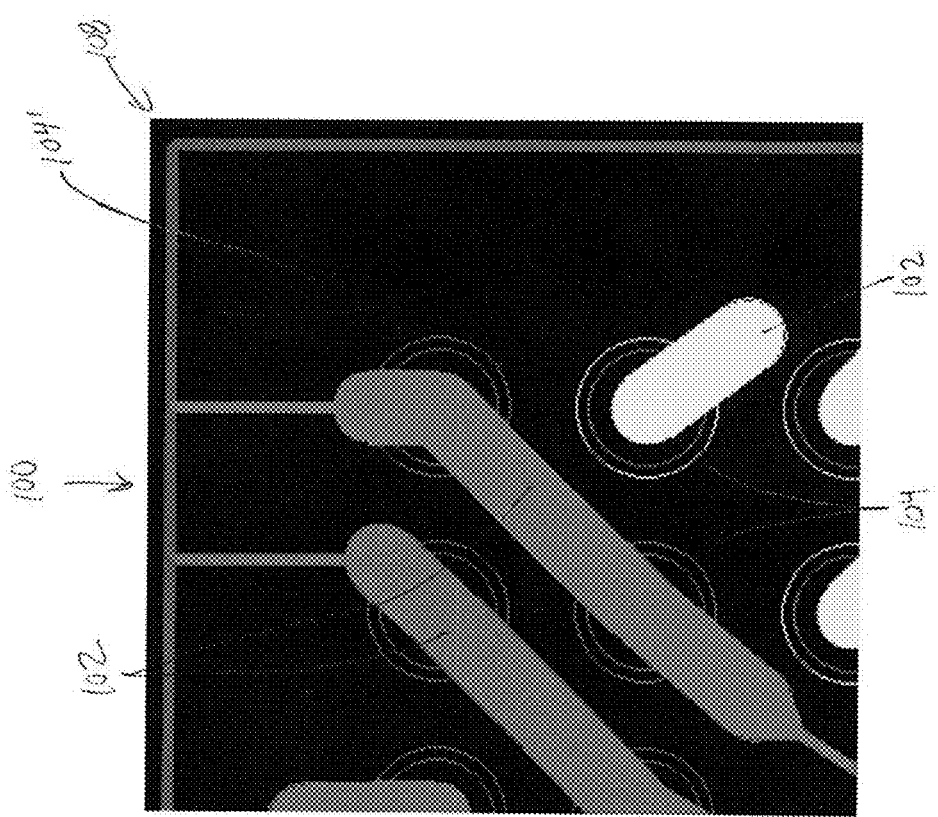

FIG. 8, which includes FIGS. 8A and 8B, shows another embodiment of a corner 108 of an existing board layout after modification with metal lines 110 that prevent solder bridging in the corner 108 of the board 100 during solder reflow. FIG. 8A shows the board layout prior to modification, and FIG. 8B shows the board layout after modification with the additional metal lines 110. The embodiment shown in FIG. 8 is similar to the embodiment shown in FIG. 7, however, the metal lines 110 for preventing solder bridging have a different layout.

Figure 9B:
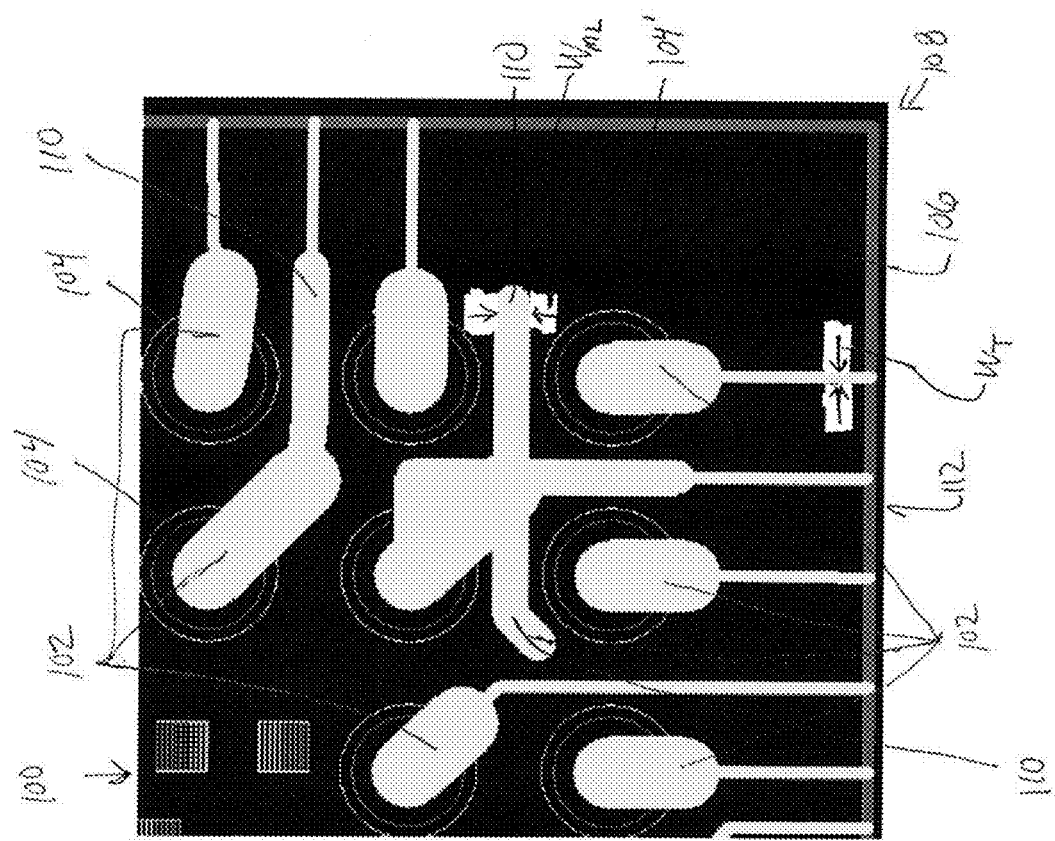
FIGS. 9A and 9B, illustrates a plan view of a corner of a circuit board before and after formation of solder bridging prevention structures, according to yet another embodiment.
Figure 9A:
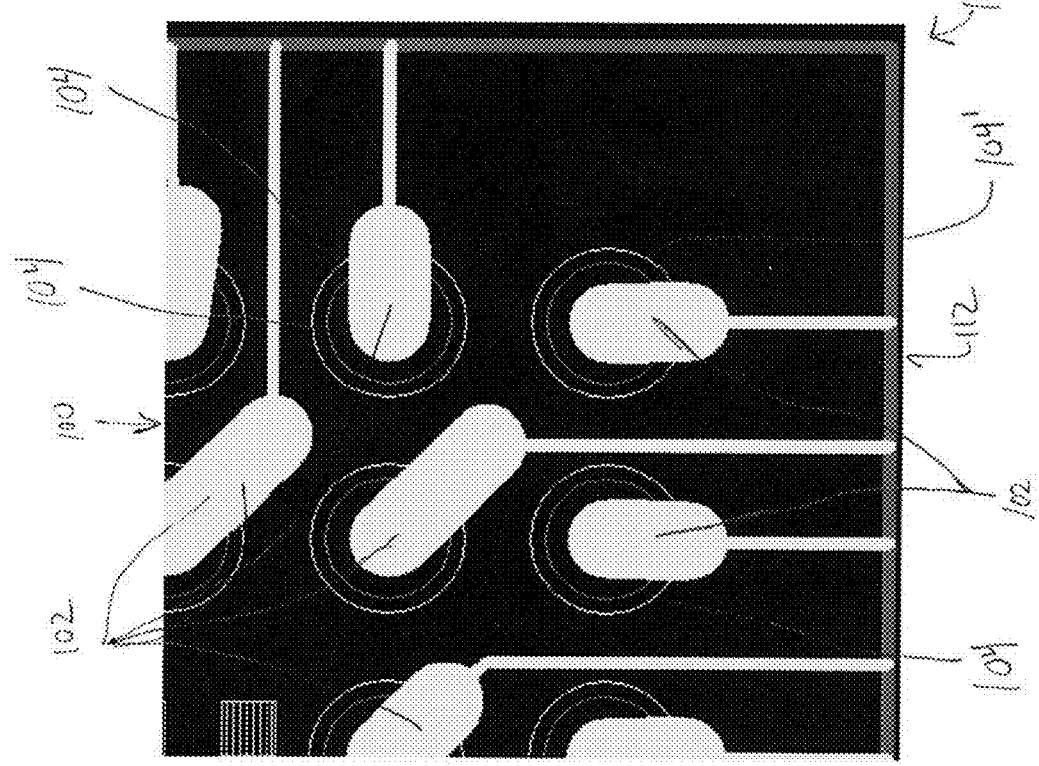

FIG. 9, which includes FIGS. 9A and 9B, shows still another embodiment of a corner 108 of an existing board layout after modification with metal lines 110 that prevent solder bridging in the corner 108 of the board 100 during solder reflow. FIG. 9A shows the board layout prior to modification, and FIG. 9B shows the board layout after modification with the additional metal lines 110. The embodiment shown in FIG. 9 is similar to the embodiments shown in FIGS. 7 and 8, however, the metal lines 110 for preventing solder bridging have yet a different layout. In each case, the traces 102 can have a width ($W_T$) at the edge of the non-conductive substrate 106 that is narrower than a width ($W_{ML}$) of the metal lines 110. In one embodiment, the traces 102 have the minimum width permitted by the board layout ground rules at the edge 112 of the non-conductive substrate 106 and the metal lines 110 have the maximum permitted width.

Figure 10:
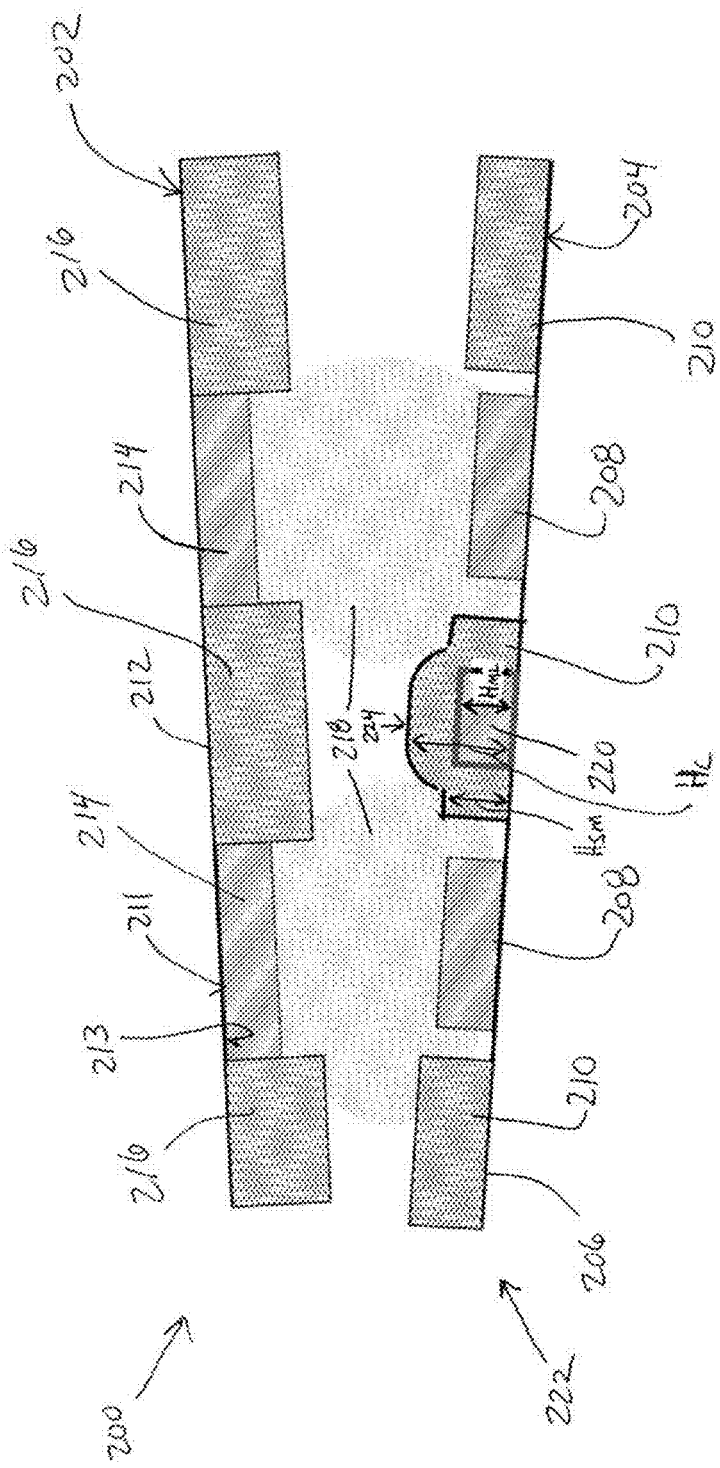
FIG. 10 illustrates a plan view of an embodiment of a semiconductor assembly including a semiconductor package attached to a circuit board and solder bridging prevention structures in the corners of the board.

FIG. 10 illustrates a partial cross-sectional view of a semiconductor assembly 200 comprising a semiconductor package 202 attached to a board 204. The part of the semiconductor assembly 200 shown in FIG. 10 is a corner region of the assembly 200. The board 204 comprises a non-conductive substrate 206 with a plurality of electrically conductive traces (out of view in FIG. 10) and pads 208 and a solder mask 210 covering the traces e.g. as previously described herein. The semiconductor package 202 comprises a semiconductor die attached to a side 211 of a non-conductive substrate 212 such as a ceramic substrate or laminate facing away from the board 204. The semiconductor die is out of view in FIG. 10, but can overlay on the board 204 e.g. as indicated by the dashed box labeled 'X' in FIG. 1. The semiconductor package 202 further comprises a plurality of electrically conductive traces (out of view in FIG. 10) and pads 214 and a solder mask 216 covering the traces on a side 213 of the non-conductive substrate 212 facing the board 204. Solder bumps (balls) 218 connect the pads 208 of the board 204 to the pads 214 of the semiconductor package 202.

According to the embodiment shown in FIG. 10, metal lines 220 e.g. of the kind previously described herein are disposed on the non-conductive substrate 206 of the board 204 under the solder mask 210 and along at least two sides of the pads 208 disposed in the corners 222 of the non-conductive substrate 206, so that a metal line 220 is interposed between the pads 208 in the corners 222 of the non-conductive substrate 206 of the board 204 and each adjacent pad 208 as previously described herein. The solder mask 210 is conformal, and therefore the metal lines 220 form a raised region 224 in the solder mask 210 along the metal lines 220. The raised region 224 of the solder mask 210 acts as a dam or barrier, preventing solder bridging in the corners 222 of the substrate 206 during reflow of the solder bumps 218.

As shown in FIG. 10, the board 204 and/or semiconductor package 202 can be warped. The warpage tends to be most extreme in the corners 222 of the semiconductor assembly 200 as previously explained herein. With such warpage, adjacent solder bumps 218 can be forced inward to one another during solder reflow (i.e. when the solder is fluid). The fluid solder must have very high energy to overcome the barrier formed by the raised region 224 of the solder mask 210, making it much more difficult for solder bridging to occur in the corners 222 of the substrate 206. Absent the metal lines 220 in the corner regions 222 of the assembly 200, the fluid solder needs far less energy to overcome the barrier created by only the solder mask 210 without the raised region 224 caused by the metal lines 220.

For example, the height ($H_{SM}$) of the solder mask 210 is typically between 10 μm and 30 μm. The metal lines 220 added to the semiconductor assembly layout for preventing solder bridging have a typical height ($H_{ML}$) between 30 μm and 50 μm. As such, in the raised region 224 of the solder mask 210, the combined height ($H_C$) of the solder bridging barrier provided by the metal lines 220 and the solder mask 210 is between 40 μm and 80 μm. Without this additional height, solder bridging in the corners 222 of the semiconductor assembly 200 would be more likely. The metal lines 220 can have any of the configurations previously described herein with regard to FIG. 1 through 9 to aid in preventing solder bridging.

Figure 11:
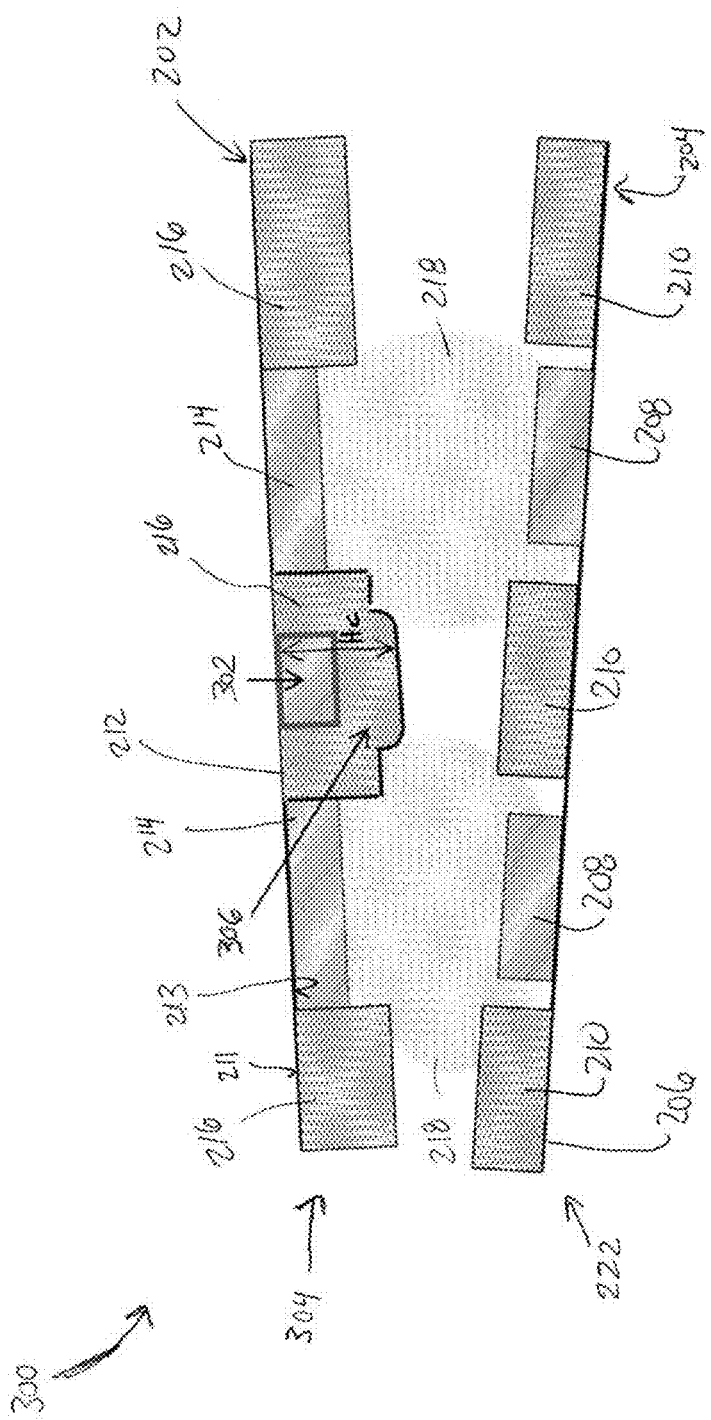
FIG. 11 illustrates a plan view of an embodiment of a semiconductor assembly including a semiconductor package attached to a circuit board and solder bridging prevention structures in the corners of the package.

FIG. 11 illustrates a cross-sectional view of another embodiment of a corner region of a semiconductor assembly 300 comprising a semiconductor package 202 attached to a board 204. The embodiment shown in FIG. 11 is similar to the embodiment shown in FIG. 10, however, metal lines 302 are disposed on the non-conductive substrate 212 of the semiconductor package 202 instead of the board 204. The metal lines 302 are formed under the solder mask 216 and along at least two sides of the pads 214 disposed in the corners 304 of the non-conductive substrate 212 of the semiconductor package 202, so that a metal line 302 is interposed between the pads 214 in the corners 304 of the substrate 212 and each adjacent pad 214 as previously described herein. The metal lines 302 form a raised region 306 in the solder mask 216 along the metal lines 220. The raised region 306 of the solder mask 216 acts as a dam or barrier as previously described herein, preventing solder bridging in the corners 304 of the semiconductor package 202 during solder reflow. The metal lines 302 of the semiconductor package 202 are typically thinner than those on the board 204, so the combined height ($H_C$) of the solder bridging barrier provided by the metal lines 302 and the solder mask 216 is less thick on the package 202 than on the board 204, but still effective at preventing solder bridging in the corners 304 of the package 202. The metal lines 302 can have any of the configurations previously described herein with regard to FIGS. 1 through 9 to aid in preventing solder bridging.

Figure 12:
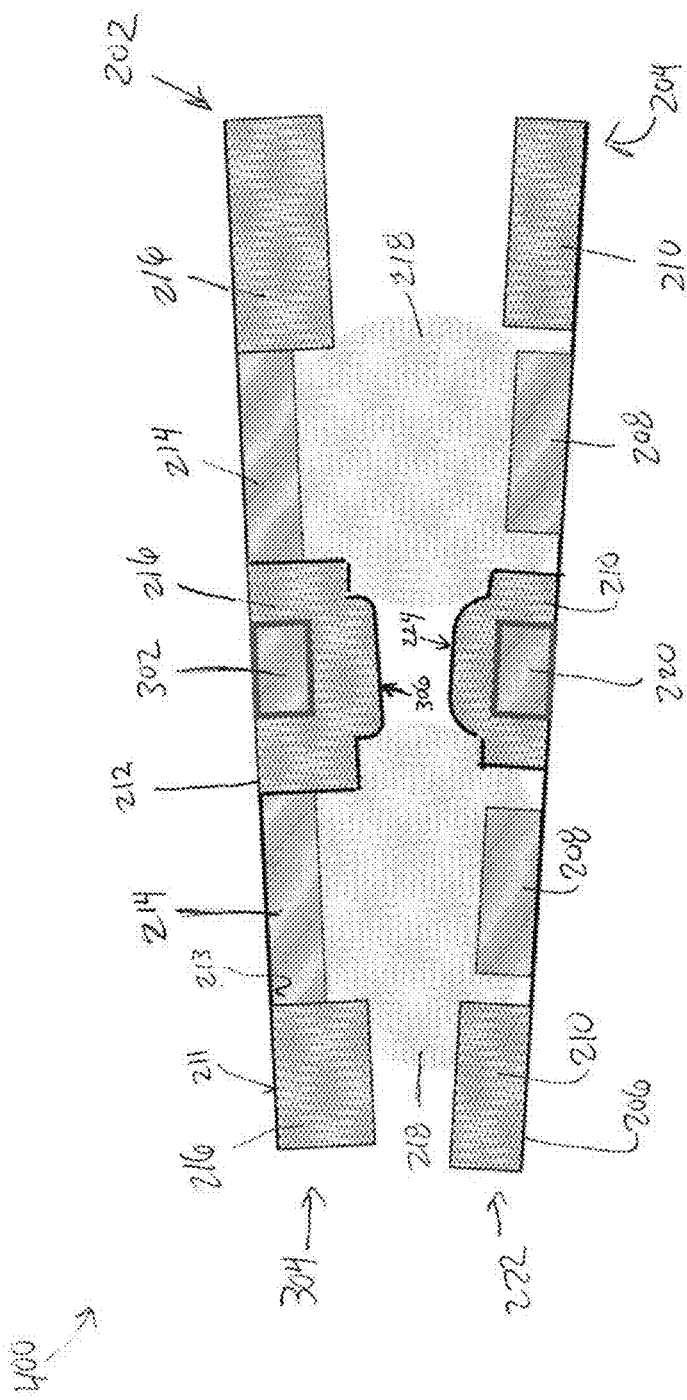
FIG. 12 illustrates a plan view of an embodiment of a semiconductor assembly including a semiconductor package attached to a circuit board and solder bridging prevention structures in the corners of both the board and the package.

FIG. 12 illustrates a cross-sectional view of yet another embodiment of a corner region of a semiconductor assembly 400 comprising a semiconductor package 202 attached to a board 204. The embodiment shown in FIG. 12 combines the embodiments shown in FIGS. 10 and 11 in that metal lines 220, 302 are disposed on the non-conductive substrate 206, 212 of both the board 204 and the semiconductor package 202. According to this embodiment, the metal lines 220, 302 are formed under the solder mask 210, 216 and along at least two sides of the pads 208, 214 disposed in the corners 222, 304 of the non-conductive substrate 206, 212 of the board 204 and of the semiconductor package 202. The resulting raised regions 306 in the solder mask 216 of the semiconductor package 202 are aligned with and face the raised regions 224 in the solder mask 210 of the board 204 as shown in FIG. 12, further increasing the height of the solder prevention barrier formed by the dam or barrier in the solder mask 210, 216 on both the board 204 and the package 202. The metal lines 220, 302 can have any of the configurations previously described herein with regard to FIG. 1 through 9 to aid in preventing solder bridging. Metal lines for preventing solder bridging can be provided in other (non-corner) regions of the semiconductor packages and boards previously described herein.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open-ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A board for mechanically supporting and electrically connecting electronic components, the board comprising:
    a non-conductive substrate;
    a plurality of electrically conductive traces and pads disposed on the non-conductive substrate;
    a solder mask applied to the non-conductive substrate and covering the traces; and
    metal lines disposed on the non-conductive substrate under the solder mask and along at least two sides of the pads disposed in corners of the non-conductive substrate, so that a metal line is interposed between the pads in the corners of the non-conductive substrate and each adjacent pad, the metal lines forming a raised region in the solder mask along the metal lines.

2. The board of claim 1, wherein the metal lines are electrically isolated from the traces and the pads.

3. The board of claim 1, wherein at least some of the metal lines are connected to the pads adjacent the metal lines or the traces connected to the pads or both.

4. The board of claim 1, wherein at least two metal lines are interposed between the corner-most pad in each corner of the non-conductive substrate and the adjacent pads.

5. The board of claim 1, wherein at least some of the metal lines terminate at an edge of the non-conductive substrate.

6. The board of claim 1, wherein the corner-most pad in each corner of the non-conductive substrate is surrounded on all sides by adjacent ones of the metal lines and an edge of the non-conductive substrate.

7. The board of claim 6, wherein the metal lines adjacent the corner-most pad in each corner of the non-conductive substrate extend perpendicular to one another and are connected at one end.

8. The board of claim 7, wherein the metal lines adjacent the corner-most pad in each corner of the non-conductive substrate terminate at the edge of the non-conductive substrate.

9. The board of claim 1, wherein a corner region of the non-conductive substrate between an edge of the non-conductive substrate and the corner-most pad disposed in each corner of the non-conductive substrate is devoid of the metal lines.

10. The board of claim 1, wherein the traces can have a width at an edge of the non-conductive substrate that is narrower than a width of the metal lines.

11. The board of claim 1, wherein the metal lines are spaced closer to the pads in the corners of the non-conductive substrate than the adjacent pads.

12. A semiconductor package, comprising:
    a non-conductive substrate;
    a semiconductor die attached to a first side of the non-conductive substrate;
    a plurality of electrically conductive traces and pads disposed on a second side of the non-conductive substrate opposing the first side;
    a solder mask applied to the non-conductive substrate and covering the traces; and
    metal lines disposed on the second side of the non-conductive substrate under the solder mask and along at least two sides of the pads disposed in corners of the non-conductive substrate, so that a metal line is interposed between the pads in the corners of the non-conductive substrate and each adjacent pad, the metal lines forming a raised region in the solder mask along the metal lines.

13. A semiconductor assembly, comprising:
    a board comprising a non-conductive substrate with a plurality of electrically conductive traces and pads and a solder mask covering the traces;
    a semiconductor package attached to the board and comprising a semiconductor die attached to a side of a non-conductive substrate facing away from the board, and a plurality of electrically conductive traces and pads and a solder mask covering the traces on a side of the non-conductive substrate facing the board;
    a plurality of solder bumps connecting the pads of the board to the pads of the semiconductor package; and
    metal lines disposed on the non-conductive substrate of at least one of the board and the semiconductor package under the solder mask and along at least two sides of the pads disposed in corners of the non-conductive substrate, so that a metal line is interposed between the pads in the corners of the non-conductive substrate on which the metal lines are disposed and each adjacent pad, the metal lines forming a raised region in the solder mask along the metal lines.

14. The semiconductor assembly of claim 13, wherein the metal lines are disposed on the non-conductive substrate of both the semiconductor package and the board.

15. The semiconductor assembly of claim 14, wherein the raised regions in the solder mask of the semiconductor package are aligned with and face the raised regions in the solder mask of the board.

16. The semiconductor assembly of claim 13, wherein the metal lines are electrically isolated from the traces and the pads of the non-conductive substrate on which the metal lines are disposed.

17. The semiconductor assembly of claim 13, wherein at least two metal lines are interposed between the corner-most pad in each corner of the non-conductive substrate on which the metal lines are disposed and the adjacent pads.

18. The semiconductor assembly of claim 13, wherein the corner-most pad in each corner of the non-conductive substrate on which the metal lines are disposed is surrounded on all sides by adjacent ones of the metal lines and an edge of the non-conductive substrate.

19. The semiconductor assembly of claim 18, wherein the metal lines adjacent the corner-most pad in each corner of the non-conductive substrate on which the metal lines are disposed extend perpendicular to one another and are connected at one end.

20. The semiconductor assembly of claim 19, wherein the metal lines adjacent the corner-most pad in each corner of the non-conductive substrate on which the metal lines are disposed terminate at the edge of the non-conductive substrate.

* * * * *